United States Patent [19]

Marko et al.

[11] Patent Number: 5,463,351
[45] Date of Patent: Oct. 31, 1995

[54] NESTED DIGITAL PHASE LOCK LOOP

[75] Inventors: Paul D. Marko, Ft. Lauderdale; Craig P. Wadin, Sunrise; David L. Brown, Miami, all of Fla.

[73] Assignee: Motorola, Inc., Schaumburg, Ill.

[21] Appl. No.: 314,830

[22] Filed: Sep. 29, 1994

[51] Int. Cl.⁶ ............................. H03L 7/07; H03L 7/10
[52] U.S. Cl. ..................... 331/1 A; 327/150; 327/159; 331/2; 331/17; 375/376
[58] Field of Search ..................... 331/1 A, 2, 17; 375/120; 327/147, 148, 156, 157, 159, 150

[56] References Cited

U.S. PATENT DOCUMENTS

| | | | |
|---|---|---|---|
| 3,983,498 | 9/1976 | Malek | 328/155 |
| 4,574,243 | 3/1986 | Levine | 328/155 |
| 4,780,844 | 10/1988 | Keller | 364/900 |
| 5,055,802 | 10/1991 | Hietala et al. | 331/16 |
| 5,093,632 | 3/1992 | Hietala et al. | 331/1 A |
| 5,095,498 | 3/1992 | DeLuca et al. | 375/94 |
| 5,097,489 | 3/1992 | Tucci | 375/120 |
| 5,163,160 | 11/1992 | Foucher et al. | 455/76 |
| 5,182,761 | 1/1993 | Beyer et al. | 375/119 |
| 5,259,004 | 11/1993 | Nakayama | 375/106 |
| 5,271,040 | 12/1993 | Clark | 375/81 |
| 5,333,153 | 7/1994 | Brown et al. | 375/104 |

OTHER PUBLICATIONS

Interim European Telecommunication Standard, Draft, Second Edition, 31 Jan. 1994, Source, ETSI TC-RES, European Telecommunications Standards Institute.

*Primary Examiner*—Siegfried H. Grimm
*Attorney, Agent, or Firm*—Pedro P. Hernandez; John G. Rauch

[57] ABSTRACT

A nested digital phase lock loop (DPLL) circuit (400) provides center bit sampling for incoming recovered data (406). Included in the nested DPLL circuit (400) are a narrow bandwidth DPLL (402) and a wide bandwidth DPLL (404) which generate first (410) and second (428) recovered clock signals respectively. Initially the first recovered clock signal (410) is used to clock in the recovered data (406) until the narrowband DPLL (402) is stabilized. Once the narrowband DPLL (402) is stabilized, the second recovered clock signal (428) generated from the wideband DPLL (404) is switched in by a multiplexer (424). If for any reason the center bit sampled data becomes corrupted, a RESET occurs in the wideband loop (404) to zero out the phase shift of the second recovered clock signal (428) to match that of the narrow loop. Thus, when a RESET occurs, the wideband loop is tracking at exactly the same clock rate as the narrowband loop.

21 Claims, 8 Drawing Sheets

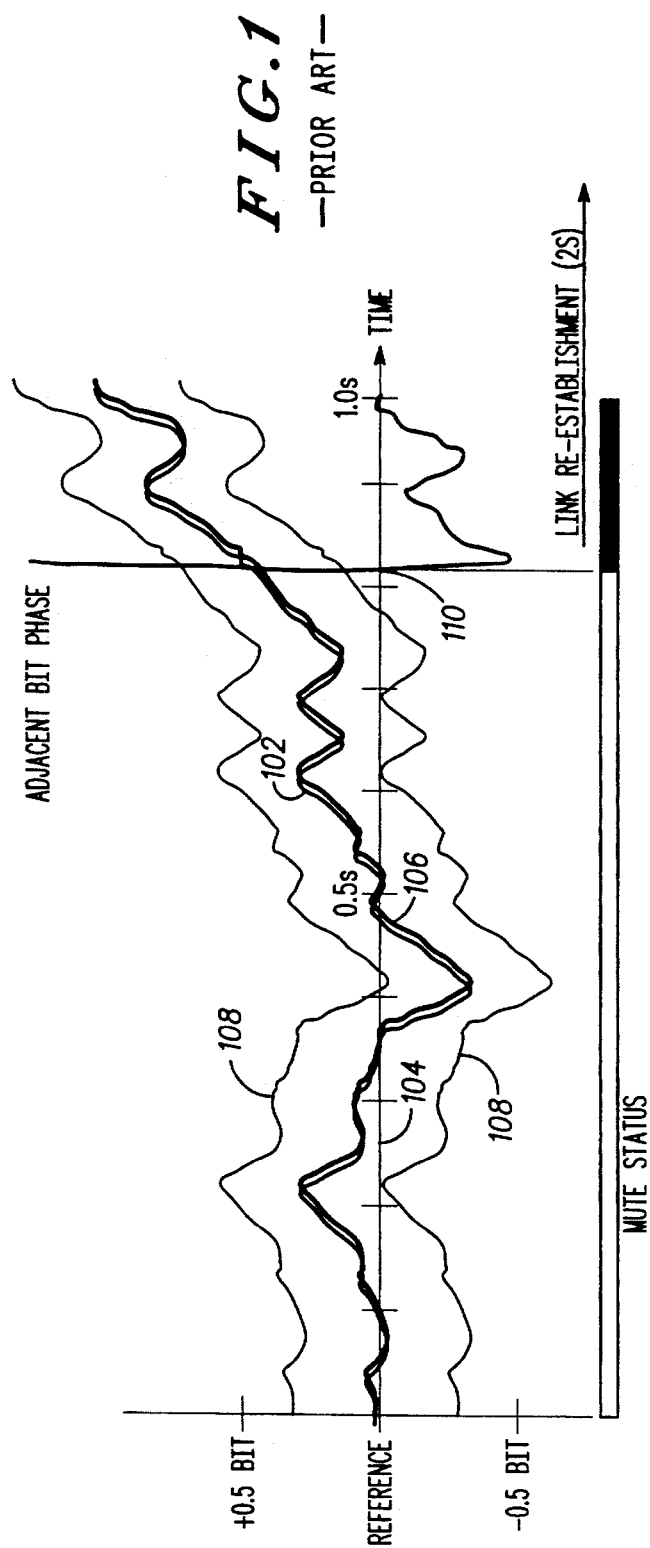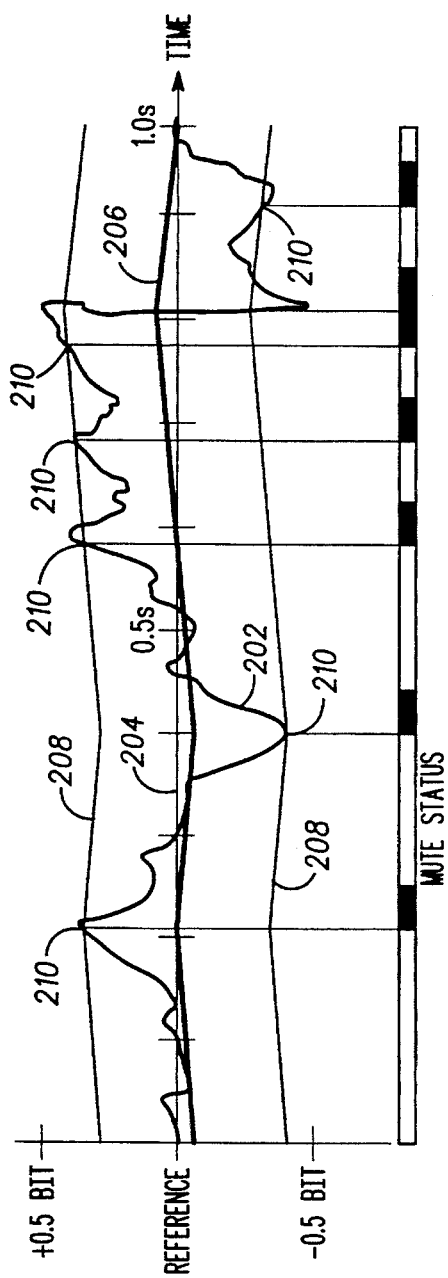
FIG.1 —PRIOR ART—
FIG.2 —PRIOR ART—

5,463,351

NESTED DIGITAL PHASE LOCK LOOP

TECHNICAL FIELD

This invention relates in general to communication devices, and more specifically to digital phase lock loops.

BACKGROUND

Loss of synchronization during communications in a digital communication system such as a second generation cordless telephone (CT2) system creates unwanted problems to system users. Loss of synchronization can be induced by selective multi-path fading, flat fading, weak signals, as well as other well known communication phenomena.

Rapid timing fluctuations of recovered baseband data induced as a result of selective multi-path fading on a communication channel have been well documented in the literature. Within a CT2 system, timing induced errors may be controlled to some extent by digital phase lock loop (DPLL) circuits. However, in a selective multi-path fading environment, baseband timing may shift by more than ±0.5 bit without substantial eye closure (degradation in signal quality). This gives rise to the possibility of bit slippage which results in a loss of synchronization.

When a typical independent wideband first order DPLL is used in a selective multi-path fading environment, the instantaneous receive baseband timing can fluctuate with respect to an absolute reference as a result of time varying channel conditions. This phenomena is illustrated in the graph of FIG. 1 where the instantaneous recovered timing of the wide bandwidth recovered clock 106 with respect to receive baseband data timing 102 are compared to a reference 104. The first order wideband DPLL recovered timing 106 can track the instantaneous baseband timing 102 closely and thus track the received data transitions well within predetermined error limits 108 for muting. However, an abrupt fluctuation of the instantaneous receive baseband timing 102 exceeding phase error limit 108 at point 110 is capable of causing the first order wideband DPLL to track over to an adjacent bit which results in a loss of synchronization. In CT2 systems, this results in a lengthy interruption in voice communication while the system re-synchronizes.

When using a typical independent narrowband second order DPLL in a selective multi-path fading environment, the second order narrowband DPLL independently compensates for the frequency offset between a fixed part (master) and reference timers in a portable part (slave), which then allows recovered timing tracking with very narrow loop bandwidths. While this mode of operation eliminates the problems encountered with the first order wideband loop (loss of synchronization due to bit slippage), the capability of tracking receive baseband timing fluctuations is highly limited. This phenomena is illustrated in the graph of FIG. 2 where the instantaneous recovered timing of the narrow bandwidth recovered clock 206 with respect to receive baseband data timing 202 are compared to a reference 204. Instantaneous receive baseband timing 202 exceeds phase error limit 208 at points 210 which can result in multiple short mutes that occur from errors between the second order narrowband DPLL and the receive baseband timing.

Hence there is a need for an improved DPLL apparatus and method that maintains synchronization and reduces the occurrences of mutes in a system subjected to such problems as multi-path fading, weak signals, interference, and flat fading.

BRIEF DESCRIPTION OF THE DRAWINGS

FIG. 1 is a graph illustrating mute status of a prior art wideband digital phase lock loop.

FIG. 2 is a graph illustrating mute status of a prior art narrowband digital phase lock loop.

DETAILED DESCRIPTION OF THE PREFERRED EMBODIMENT

Figure 3:
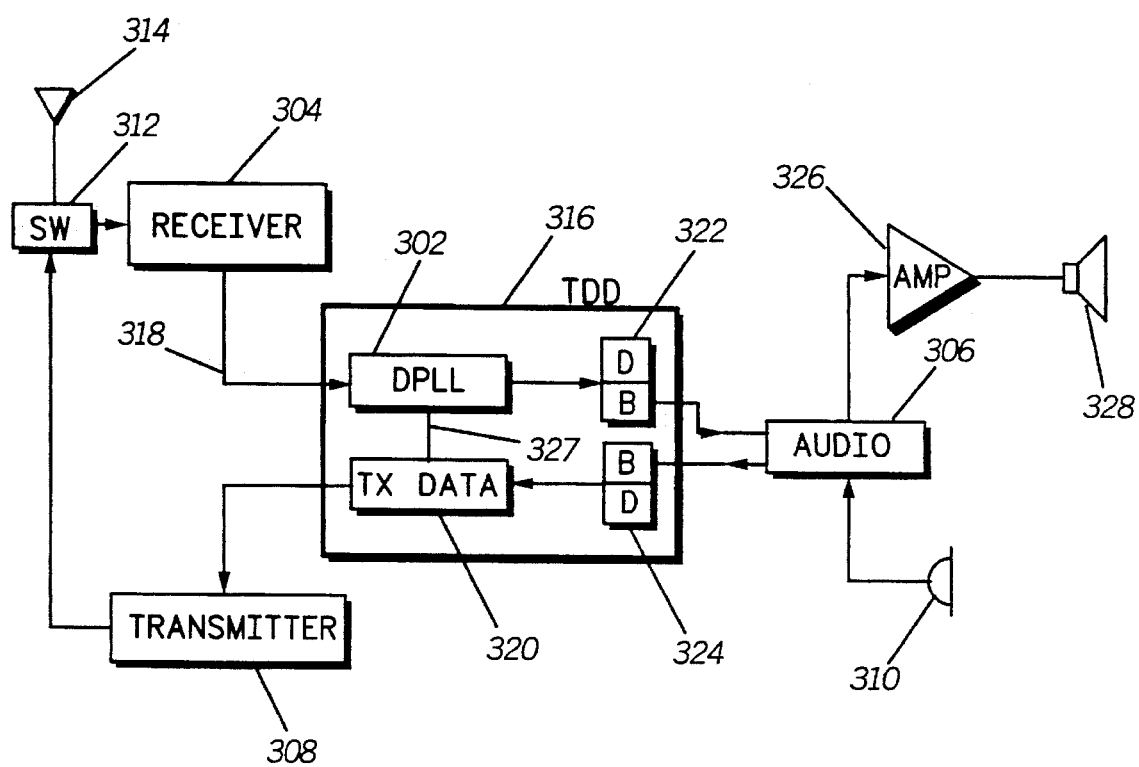
FIG. 3 is a block diagram of a radio in accordance with the present invention.

Referring to FIG. 3, there is shown a simplified block diagram of a radio telephone handset 300 including a nested digital phase lock loop (DPLL) circuit 302 in accordance with the present invention and to be described herein. The handset 300 is preferably a CT2 handset which comprises a receiver 304, an audio section 306, and a transmitter section 308 for transmitting signals that include voice received at microphone 310. For a better understanding of the overall CT2 system communication protocol, one is referred to a publication entitled, "Common Air Interface Specification to be used for the inter working between cordless telephone apparatus in the frequency band 864.1 MHz (megahertz) to 868.1 MHz", dated 31st Jan. 1994, which is published by the European Telecommunications Standards Institute and is hereby incorporated by reference. The CAI establishes a time-division multiplexed protocol having alternating one millisecond receive and transmit frames separated by guard time segments. In one multiplexed scheme each transmit/receive segment includes a B channel (64 bits) and D channel which contains 1 or 2 bits before and after the B channel.

An antenna switch 312 alternately switches the transmitter 308 and the receiver 304 to an antenna 314, in accordance with the established protocol. A time division multiplexer (TDD) 316 is coupled to the receiver front end 304, to the transmitter 308, and to the audio section 306 to provide time division multiplexing and receive/transmit framing of the digital signals. The audio section 306 is used to control audio from the microphone 310 and from the receiver front end 304. Received audio is amplified at amplifier 326 and directed to speaker 328.

The nested digital phase lock loop circuit 302 is included as part of the TDD circuit 316 so that it can provide a data tracking system that reduces the impact of selective multi-path fading on recovered data. Receive data 318 is sent to TDD 316 while transmit data 320 is sent from TDD 316 to transmitter section 308. Also part of the TDD circuit 316 are registers 322 and registers 324 which temporarily store the D and B channel data. Registers 322 store data for the receive side, while registers 324 store data for the transmit side. Line 327 provides a recovered clock signal from nested DPLL circuit 302 to the transmit data registers 324 in order to synchronize the transmit data.

Figure 4:
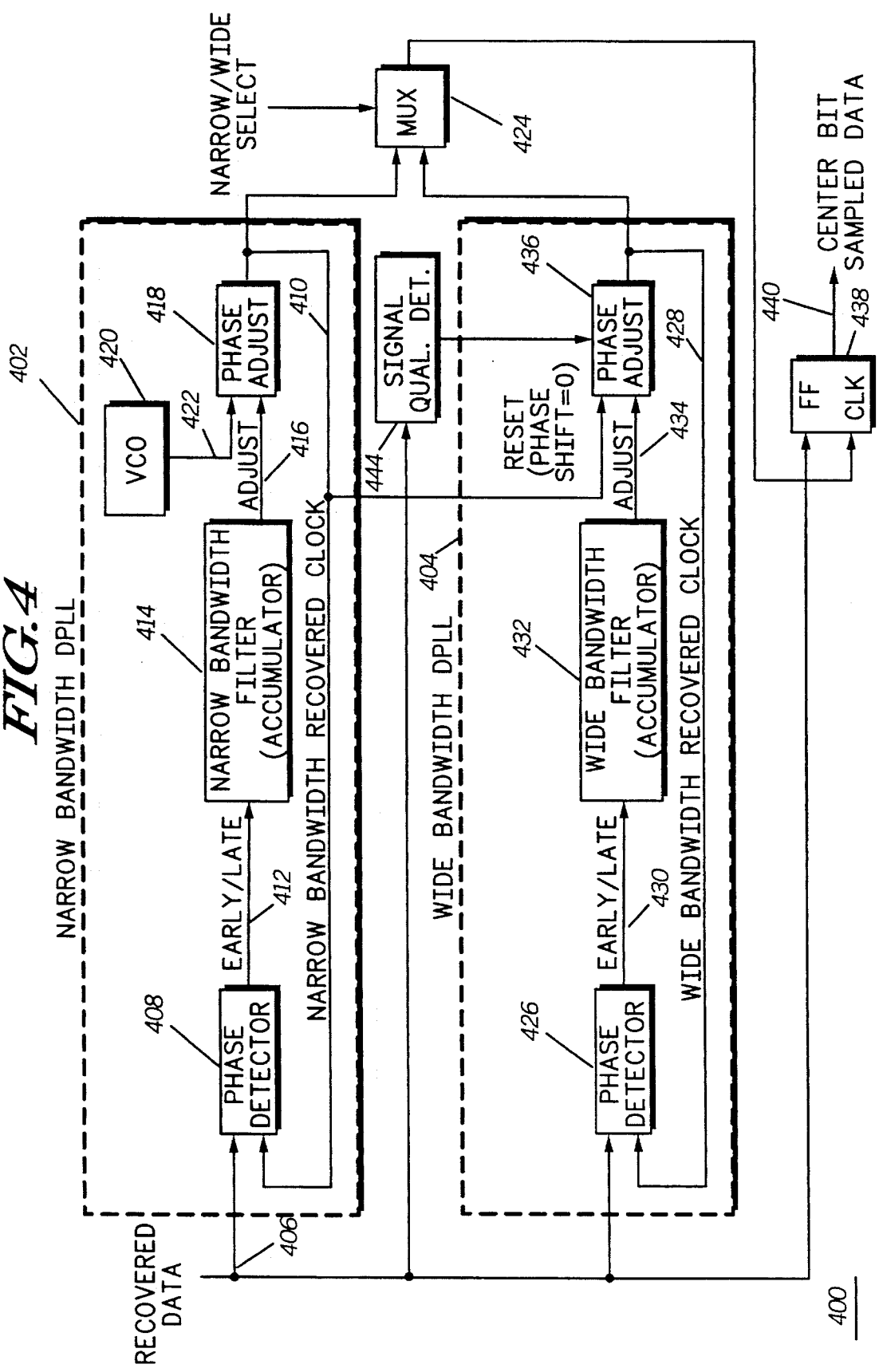
FIG. 4 is a electrical block diagram of a nested digital phase lock loop circuit in accordance with the present invention.

Referring now to FIG. 4, a simplified block diagram of a nested digital phase lock loop circuit 400 in accordance with the present invention is shown. Included in the nested DPLL 400 are narrow bandwidth DPLL 402 and wide bandwidth DPLL 404.

Briefly, the two phase lock loops 402, 404 are operatively coupled in parallel forming the nested phase lock loop circuit 400. The nested phase lock loop circuit 400 includes a narrow bandwidth PLL (2nd order or 1st order) which detects transitions and accumulates early/late transitions indicating phase errors in recovered data transitions 406 when compared to a recovered clock signal 410 (to be described later). Early and late transitions are accumulated and counted in an up/down counter 414 which are compared to a threshold. When a large enough number of errors (early/late transitions) have been accumulated, an instantaneous adjustment is made to the phase of a reference signal 422 generated from a clock 420, preferably a digital reference clock. The narrow bandwidth recovered clock signal 410 is thus produced, and is then used as the master clock signal for the wideband DPLL circuit 404, also referred to as wideband loop.

Similar transition detecting and error accumulation occur in the wideband loop 404. A maximum amount of phase shift is allowed, preferably less than ½ bit, such that the wideband loop can provide fast data tracking and make quick phase adjustments dependent on the number of accumulated errors occurring. The timing for the wideband loop 404 is shifted and can be adjusted more quickly than the timing of the narrowband loop 402. The advantage of this is that the wideband loop 404 can be adjusted frequently without the problem of bit slippage because the wideband loop is slaved (locked) to the narrowband loop 402. The nested PLL circuit 400 allows for adjustment of rapid fluctuations in the recovered data 406 induced by delay spread on the channel.

Describing the nested digital phase lock loop circuit 400 in more detail, recovered data 406 is received, preferably at a rate of 72 kilobits per second (kbps), at both the narrowband and wideband DPLLs, 402,404. Narrowband DPLL 402 receives the data, preferably in binary form, at phase detector 408 and determines the phase of the incoming signal with respect to a narrow bandwidth recovered clock signal 410. The phase detector 408 then generates a signal identifying the early/late status 412 of the incoming transitions, based on the result of the incoming signal 406 phase comparison. This early/late transition signal 412 is then routed to a narrow bandwidth filter 414 which accumulates the number of early or late transitions and compares the number to a predetermined threshold. This early/late accumulator is preferably implemented with an up/down counter, where each early transition causes the counter to count up one count, and each late transition causes the counter to count down one count. Once the magnitude of early or late transitions reaches the predetermined threshold, a predetermined adjust enable is generated in order to enable a phase adjust circuit 418. The distinguishing characteristic of the narrow bandwidth filter 414, as compared to the wide bandwidth filter 432, is that its predetermined threshold is an order of magnitude or more larger than the predetermined threshold of the wideband filter.

The digital voltage controlled oscillator (VCO) 420 is coupled to the phase adjust circuit 418 and generates a reference clock signal 422 which gets phase adjusted by preferably 1/32 of a bit by the phase adjust circuit 418 in response to said phase adjust circuit being enabled. The phase adjust circuit 418 then provides the phase adjusted signal as narrow bandwidth recovered clock signal 410. The narrow bandwidth recovered clock signal 410 is returned to the phase detector 408 where it is used as a reference for the recovered data input signal 406. The narrow bandwidth recovered clock signal 410 is also forwarded to a multiplexer 424, in this case a 2:1 multiplexer, as a select option. The multiplexer 424 will select the narrowband loop 402 during initialization and until the narrowband loop has stabilized (i.e., locked).

Referring now to wideband loop DPLL circuit 404, the recovered data signal 406 is received at phase detector 426 which determines the phase of the received signal with respect to a wide bandwidth recovered clock signal 428 (to be described later). The phase detector 426 then generates early/late signals 430 based on the phase of the incoming signal 406. The early/late transition signal 430 is forwarded to a wide bandwidth filter (accumulator) 432 which accumulates the number of early/late transitions and compares the number to a predetermined threshold. This early/late accumulator is preferably implemented with an up/down counter, where each early transition causes the counter to count up one count, and each late transition causes the counter to count down one count. The wide bandwidth filter 432 compares the number of transitions to a predetermined threshold and provides an adjust output 434 indicating whether to increment or decrement a phase shift value in a phase shift circuit 436, once a predetermined number of early or late transitions have been accumulated.

The narrowband recovered clock signal 410 generated by the narrow bandwidth DPLL 402 is also routed to the wide bandwidth DPLL phase shift circuit 436. The narrow bandwidth recovered clock signal 410 will be shifted by a predetermined amount when the phase shift circuit 436 is enabled by the adjust output 434. The maximum allowable phase shift is preferably set to 15/32 bit and is reset to a phase shift of 0 upon initial start up and when poor signal quality is detected by a signal quality detector 444. The phase shifted output is returned back to the phase detector 426 as wide bandwidth recovered clock signal 428 and also forwarded to the other input of the multiplexer 424.

In the preferred embodiment, the adjust enable 434 resets the phase shifter circuit 436 and acts as both an enable value and an increment indicator which controls adjustments by 1/16 of a bit in either direction up to 15/32 a bit. The adjust enable also indicates the direction of the shift based on whether the accumulated transitions are early or late. The wideband phase shifted recovered clock signal 428 is then compared to the incoming recovered data at phase detector 426.

As previously mentioned, the multiplexer 424 initially selects and continues to select the narrowband loop 402 until it has locked. Once the narrowband loop 402 has stabilized (i.e., locked), the wideband loop 404 will be selected by multiplexer 424. The selected signal, either the narrow bandwidth recovered clock signal 410 or the wide bandwidth recovered clock signal 428, is routed to a logic gate, preferably a flip flop 438. The logic gate 438 clocks in the recovered data signal 406 using the selected (narrow or wide bandwidth) recovered clock and generates an output as center bit sampled data signal 440. Thus, the timing transitions of the two phase lock loops 402, 404 operatively coupled in parallel are phase adjusted with one phase adjusted signal 410 acting as the reference or master for the second phase adjusted signal 428. During the locking period, the narrowband loop 402 is executing a training cycle to correct for frequency disparities between the digital VCO 420 and the incoming data, which is required in the preferred embodiment prior to narrow bandwidth operation. It should be noted that in other applications, where tolerances between the digital VCO and recovered data are sufficiently tight, the initial lock period may not be required and wide bandwidth recovered clock 428 may be fed directly to flip flop 438.

Referring back to FIG. 3, the transmitter timing, as well as the remainder of the transmit and receive register timing, is derived from the narrowband recovered clock of the nested digital phase lock loop circuit as described by the invention. This provides a stable timebase for the transmit return path to the fixed (radio) part, which reduces the round trip timing fluctuations in the TDD system by approximately a factor of 2 over the typical wideband DPLL implementation.

Figure 5:
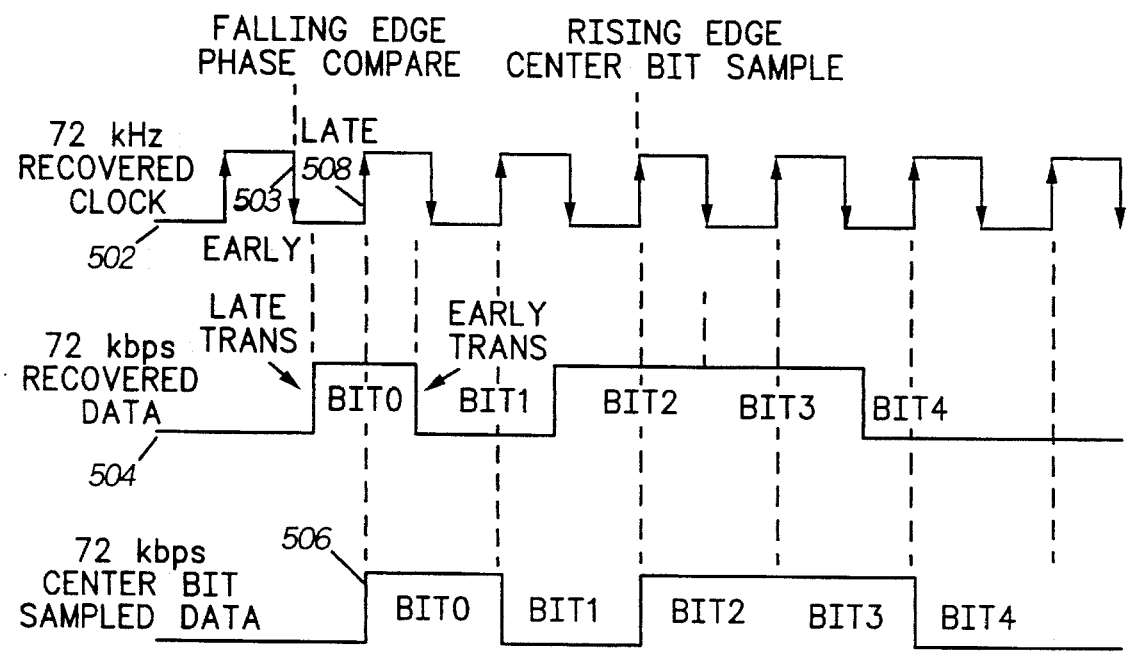
FIG. 5 is a prior art timing diagram circuit comparing timing and data signals from a prior art phase lock loop.
Figure 6:
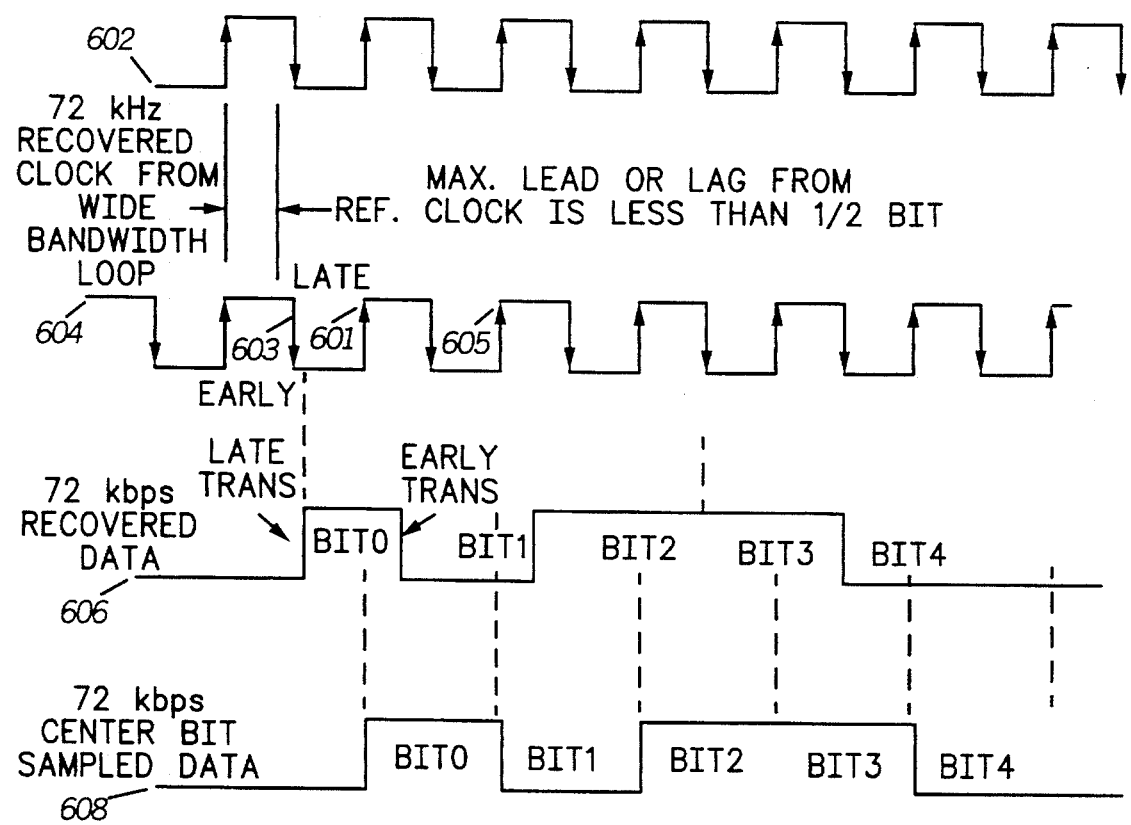
FIG. 6 is a timing diagram comparing timing and data signals from the nested digital phase lock loop circuit in accordance with the present invention.

FIGS. 5 and 6 of the accompanying drawings compare the center bit sampling associated with a prior art (either wideband or narrowband) DPLL and the center bit sampling associated with the nested digital phase lock loop as described by the invention. Referring now to FIG. 5 there is shown a prior art timing diagram showing recovered clock 502, preferably set to 72 kHz, recovered data 504, and center bit sampled data 506. The recovered data rate 504 is preferably set to 72 kbits (36 kHz). Recovered data transitions, which may contain significant jitter induced from the radio channel, are phase compared to the falling edge of the recovered clock signal 502. The transition is determined to be early or late with respect to the falling edge of the clock signal 502. In this case, bit 0 of recovered data signal 504 has a first rising transition after the falling edge 503 of the recovered clock 502 and thus occurs in a late window.

The next transition of the recovered data signal 504 (bit 0) occurs before the next falling edge of the recovered clock 502 and is therefore considered an early transition. The following transition occurring at the end of bit 1 of the recovered data 504 is considered early when phase compared to the falling edge of the recovered clock signal 502. When a transition occurs, the phase detector will generate a high or low output signal depending on which window (early or late) the incoming transition falls. The phase detector output signal is then typically coupled to a filter/accumulator as described earlier.

Next the recovered data 504 is center bit sampled with respect to the rising edge of the recovered clock 502 with the result being center bit sampled data 506. For example, the rising edge 508 of the clock 502 aligns with the center of bit 0 of the recovered data 504. Transitions on the resultant center bit sampled data signal 506 only occur on the rising edges of the recovered clock 502, which results in a clean 72 kbit signal suitable for processing by the post detection digital logic.

Referring now to FIG. 6, there is shown a set of timing diagrams associated with the nested digital phase lock loop as described by the invention. The first 72 kHz clock signal 602 is similar to that of the prior art signal except that it is being generated in a narrow bandwidth mode. Next, a second 72 kHz clock signal 604 is generated from a wide bandwidth loop with an allowable shift of just slightly less than ±½ a bit from the first 72 kHz clock signal 602. Narrowband recovered clock signal 602 is considered the master and wideband recovered clock signal 604 is considered the slave. The falling edge of the second recovered clock signal 604 is used to phase compare the recovered data 606. Center bit sampled data 608 is generated by clocking in the recovered data 606 using the rising edge of the second recovered clock signal 604. Transition 601 is used as the first center bit sample location for bit 0, the next center bit sample occurs at 605. The rising edge of the wideband recovered clock signal occurs after the rising edge of the narrowband recovered clock signal and is therefore lagging by less than ½ bit in this example. The first transition of recovered data bit 0 is compared to falling edge 603 of the wideband recovered clock and is considered a late transition. The next recovered data transition of bit 0 occurs before the falling edge and is considered an early transition. All comparisons of the recovered data 606 are made with respect to the second recovered clock signal 604 once the narrowband loop has been locked as previously described.

The difference between the timing diagrams of FIGS. 5 and 6 is the addition of the second, coupled, 72 kHz wideband loop signal, which can be shifted and adjusted more quickly than the timing of the narrowband loop. This is a main advantage, as the wideband loop can be adjusted frequently without the problem of tracking over to the adjacent bit, because the wideband loop is slaved within ½ bit of the narrowband loop. These recovered clock signals 602, 604 represent the recovered clock signals 410 and 428 of the block diagram of FIG. 4. The center bit sampled data 608 represents the center bit sampled data signal 440 of FIG. 4.

Figure 7:
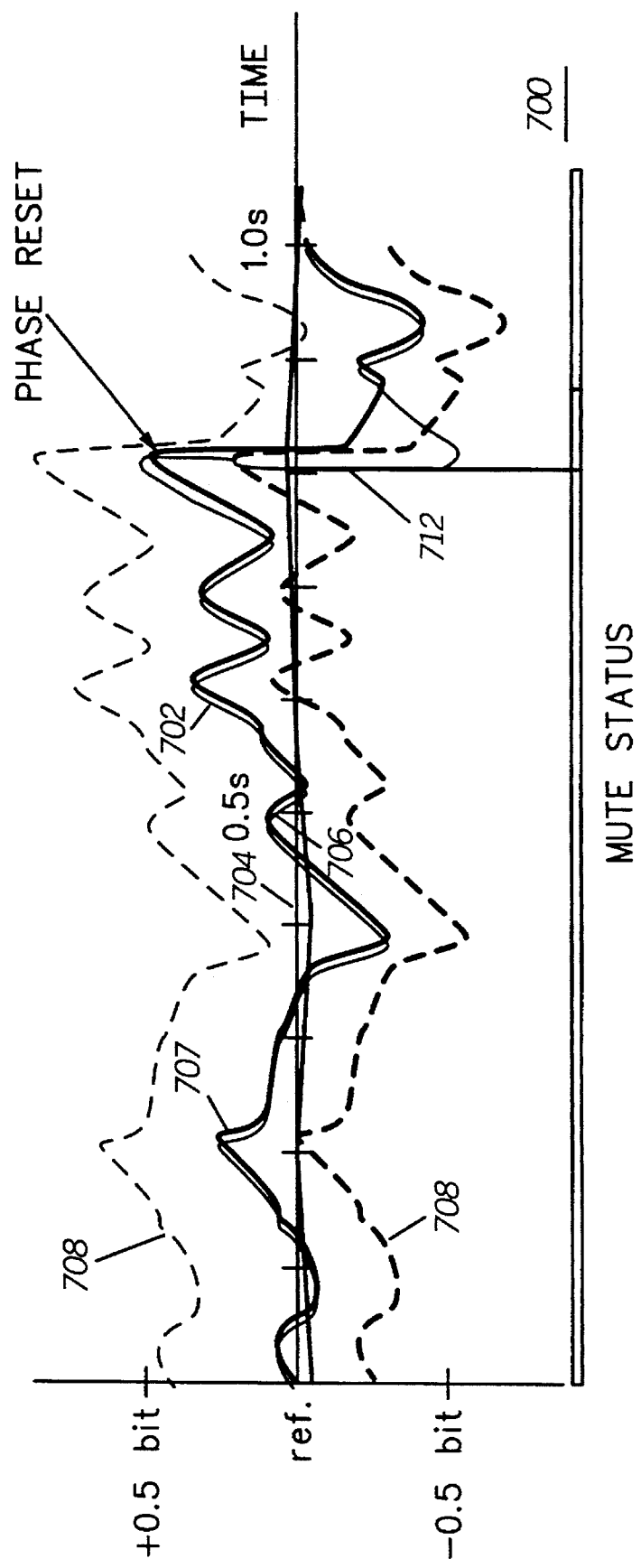
FIG. 7 is a graph illustrating an example of mute status using the nested digital phase lock loop in accordance with the present invention.

The nested loop recovered timing, as determined by the 72 kHz wideband loop recovered clock of the nested digital phase lock loop, is responsible for fewer error occurrences and therefore less mute occurrences in the portable. This can be shown from the graph of FIG. 7 where the instantaneous recovered timing of the wide and narrow bandwidth recovered clocks with respect to recovered baseband data timing are illustrated for the nested digital phase lock loop, as described by the invention. The reference is shown as line 704 and the narrowband loop recovered clock timing is represented by line 706. The phase error limit 708 is preferably set to ±0.4 bits with reference to the wideband loop recovered clock timing. Received baseband timing 702 is tracked closely by wideband loop recovered clock timing 707. The received baseband timing exceeds the phase error limit at point 712 causing a phase reset to occur. However, overall fewer mutes, as compared to graphs of FIGS. 1 and 2, have occurred. The graph 700 illustrates the improvement achieved using the nested DPLL as described by the invention. The advantage of the wideband DPLL for tracking the receive baseband timing fluctuations is maintained, while eliminating the bit slippage problem by limiting phase tracking to $15/32$ of a bit maximum from the narrowband DPLL recovered timing.

Figure 8:
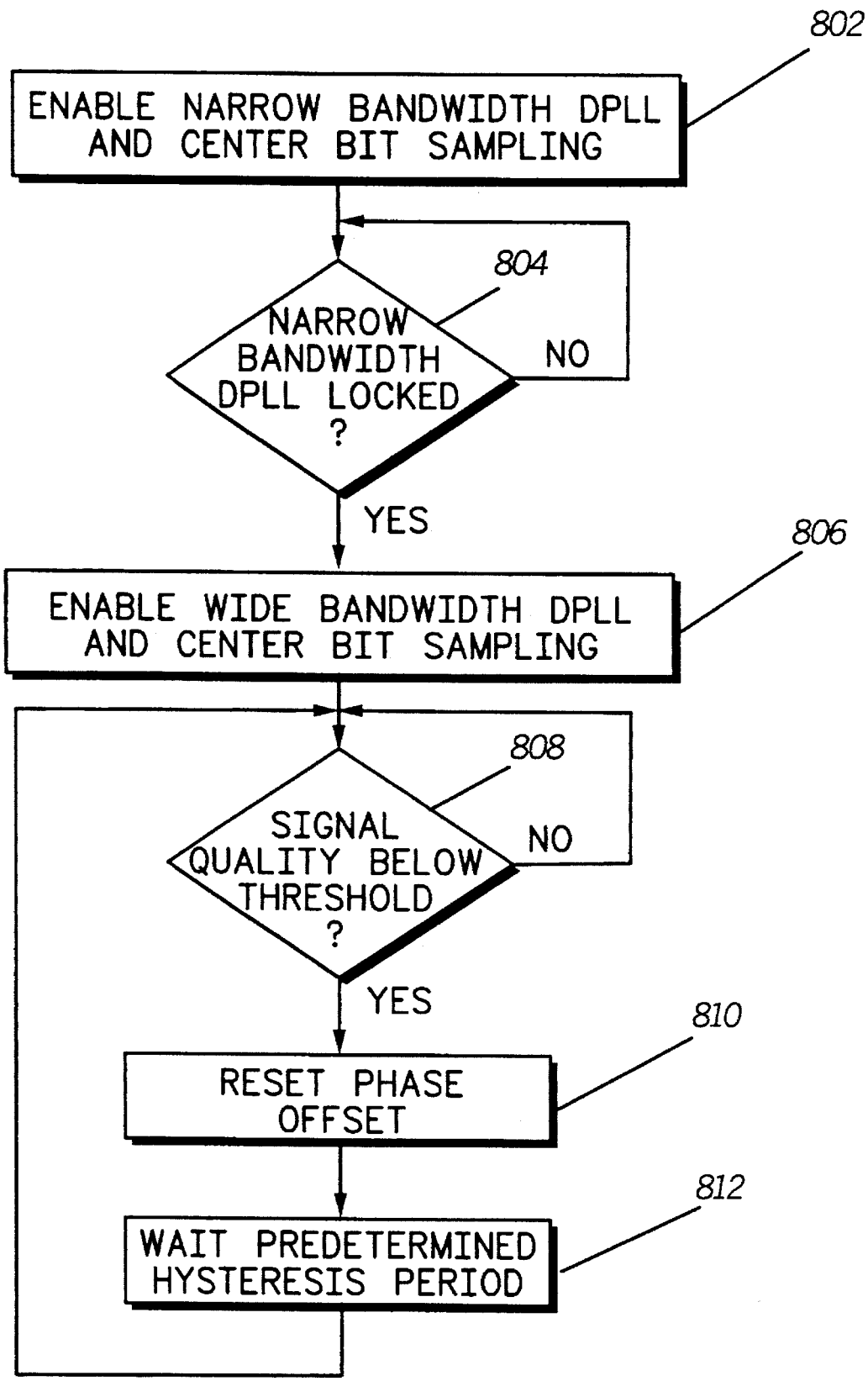
FIG. 8 a flow chart in accordance with the present invention.

Referring now to FIG. 8 of the accompanying drawings, there is shown a flow chart 800 describing the preferred method for employing the nested digital phase lock loop circuit as described by the invention. In step 802 the center bit sampling of the narrow bandwidth DPLL is enabled and will remain enabled until the narrow bandwidth DPLL is locked as determined by step 804. During steps 802 the clock from the narrowband PLL is selected by the multiplexer to provide the center bit sampling.

Once the narrowband loop is locked in step 804, the wide bandwidth digital sampling is enabled using the wide bandwidth PLL and its center bit sampling in step 806. The incoming data will continue to be tracked using the wideband loop until the signal quality drops below a predetermined threshold. If the signal quality does drop below the predetermined threshold then the wideband recovered clock signal is reset to a phase offset of 0 such that the wideband recovered clock signal is aligned with the narrowband recovered clock signal. This step is accomplished using the phase shifter 436 of FIG. 4 and does not stop the wide bandwidth digital tracking process.

After a reset has occurred in step 810, a predetermined hysteresis wait period is completed before going back to check the signal quality again at step 808. This hysteresis period allows the wideband loop to come back and get locked in with the baseband recovered data. The phase shift of the wideband loop recovered clock back to 0 forces it back to the narrow phase recovered clock which will allow tracking to start again. This allows the recovered clock time to track back to the correct phase. Since the signal quality may not become good immediately once a reset has occurred, the hysteresis provides a wait period to allow the wideband loop to realign with the incoming data. If signal quality remains poor, this loop from steps 812 to 808 continues until a communication link is terminated between a handset and a base.

Figure 9A:
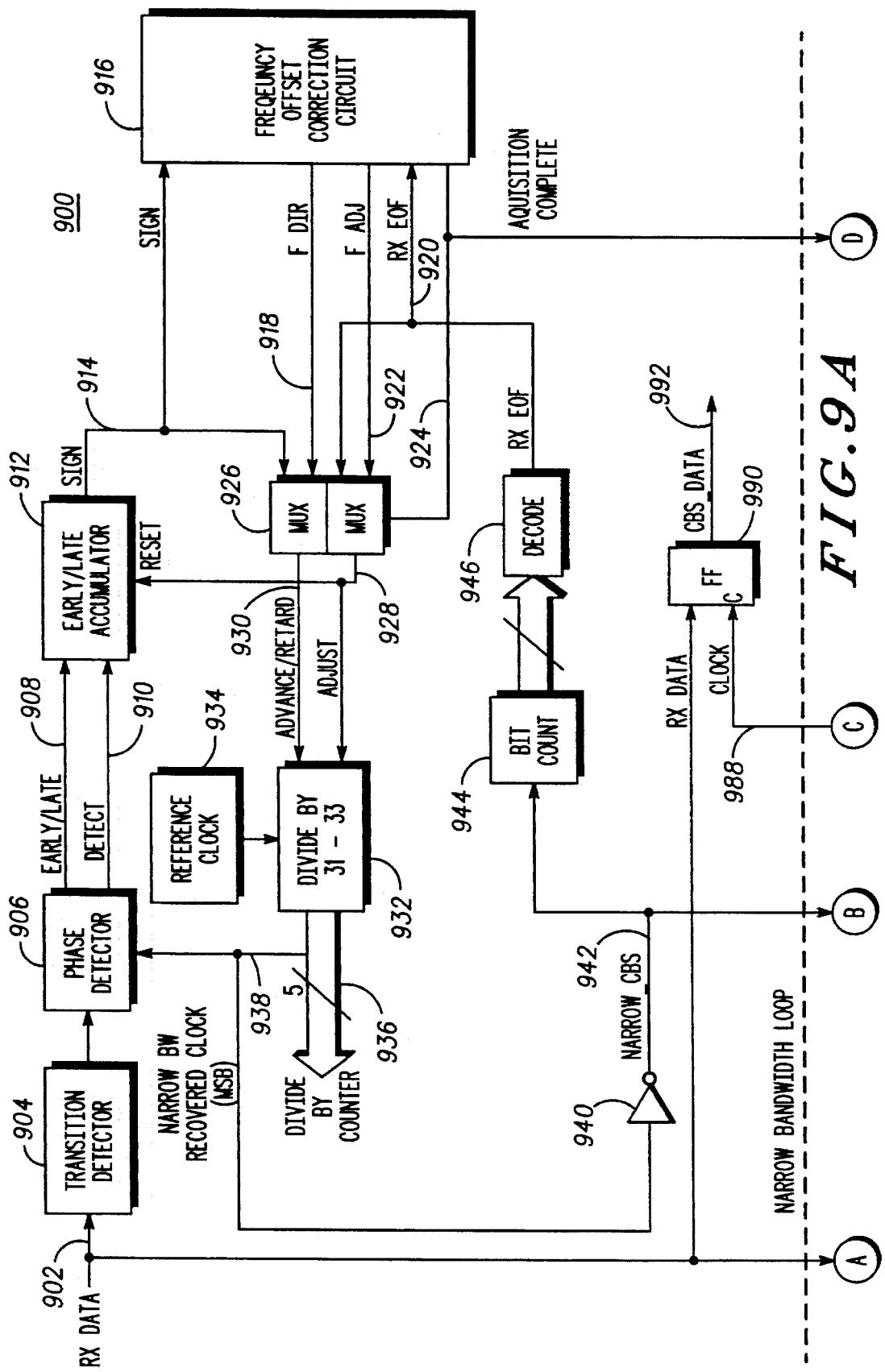
FIG. 9 is a detailed block diagram of the nested digital phase lock loop in accordance with the present invention.
Figure 9B:
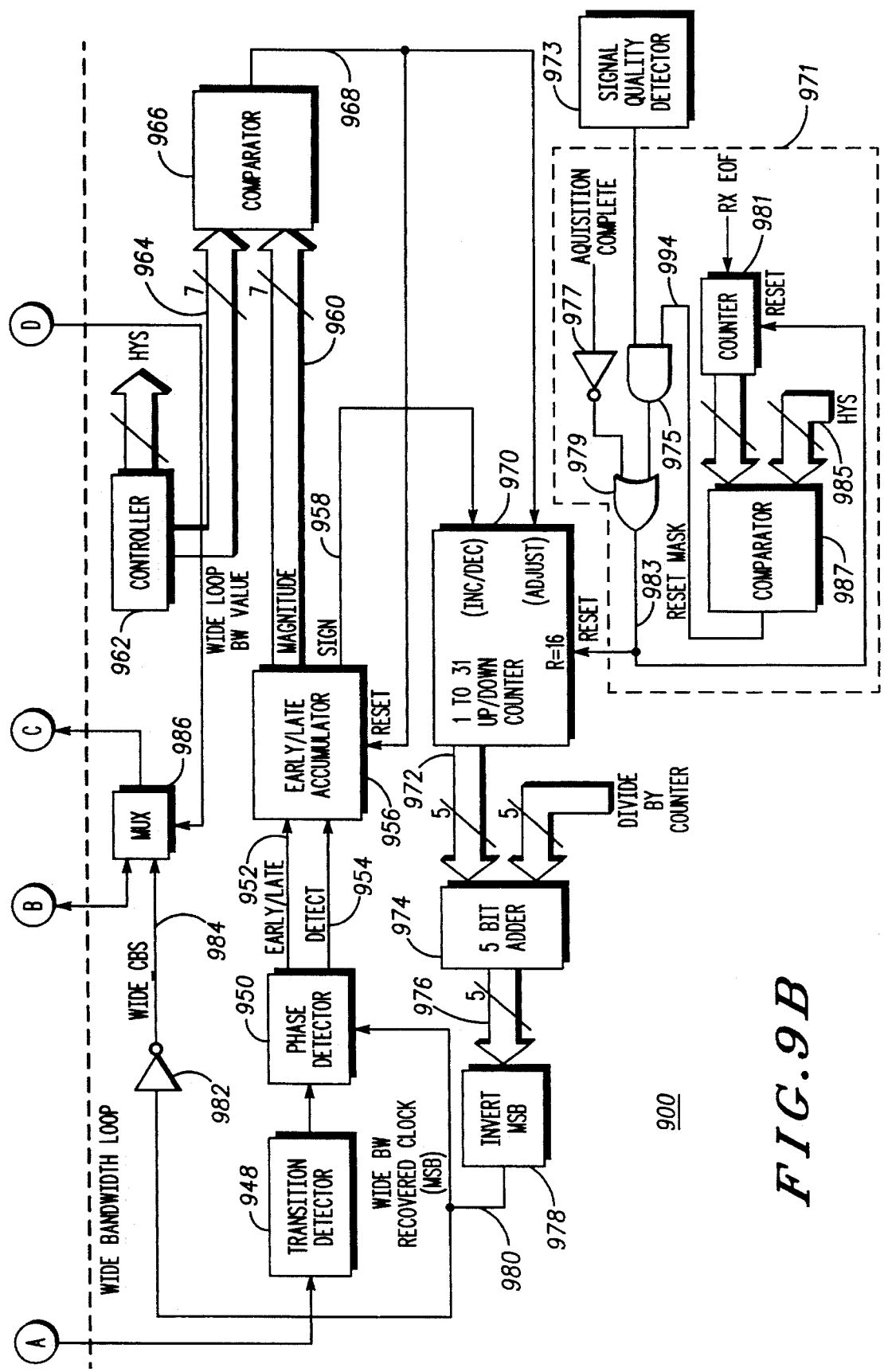

Referring to FIG. 9, there is shown a detailed block diagram of the preferred embodiment of a nested digital phase lock loop 900 in accordance with the present invention.

A description of the operation of PLL 900 begins with a RX data input signal 902 from the radio frequency receiver entering the narrowband loop. This RX data signal is preferably a 72 kbit/s hard limited data signal derived from a receiver demodulator (not shown). The RX data signal 902 is applied to transition detector 904, which samples incoming data on preferably 1/32 bit boundaries and detects whether or not a transition has occurred. The registered transitions are then applied to the phase detector 906 for phase comparison with a narrow bandwidth (narrow BW) recovered clock signal 938 of preferably 72 kHz. The narrow BW recovered clock signal 938 is derived from a reference clock 934 with programmable divider 932. The reference clock 934 is preferably 2.304 MHz which is 32 times the recovered clock frequency of 72 kHz. Programmable divider 932 is implemented with a 5-bit counter which is nominally reset after each 32 cycles of the reference clock. The most significant bit (MSB) output from divider 932 yields a nominal 50% duty cycle, 72 kHz, narrow BW recovered clock signal 938. A pulse on an adjust input line 928 will cause programmable divider 932 to divide by 31 or 33, depending on the status of an advance/retard signal 930, for one cycle of the 72 kHz recovered clock 938. This results in advancing or retarding the recovered clock signal 938 by 1/32 of a bit. These adjustments align the rising edge of the 72 kHz recovered clock signal 938 to bit transitions in the 72 kbit data stream 902 which also aligns the falling edge of the recovered clock signal to the bit centers in the 72 kbit data stream. Next, the narrow BW recovered clock signal 938 is applied to inverter 940 to generate the narrow center bit sample (NARROW_CBS) signal 942 having a rising edge aligned with the RX data 902 bit centers.

Phase detector 906 outputs the result of the phase comparison between the incoming data transition and the recovered clock 938 on an early/late line 908 and provides a detect signal on line 910 when the comparison is complete. The difference between the number of early or late transitions is accumulated in an early/late accumulator 912, which is preferably implemented with an up/down counter. A sign output 914 provided by the early/late accumulator 912 signifies whether more early transitions or more late transitions have occurred during the accumulation period. The sign output 914 is coupled to multiplexer pair (mux) 926 and to a frequency offset correction circuit 916. Mux pair 926 consists of two 2:1 multiplexers which are both controlled by an acquisition complete signal 924 generated from the frequency offset correction circuit 916.

The acquisition complete signal 924 is an output generated from the frequency offset correction circuit (FOCC) 916 which signifies when the FOCC has completed a training sequence and is ready to take control of adjusting the programmable divider 932 and resultant recovered clock 938. During the training sequence, the acquisition complete signal 924 is low and mux pair 926 couples the sign 914 to the advance/retard output 930 and also couples a Receive End of Frame (RX EOF) 920 to the adjust output 928. The RX EOF signal 920 is a pulse output derived from a bit counter 944 with decoder block 946. Bit counter 944 cycles from 0 to 143 bits which spans the transmit and receive slots of each 2 ms, 144 bit CT2 frame. At the end of each receive window, adjust signal 928 pulses high which causes programmable divider 932 to divide by 31 or 33, according to the sign 914 of the early/late accumulator, for one 72 kHz cycle only. Each adjustment to the programmable divider 932 also resets or clears the early/late accumulator 912 so that the accumulator will only accumulate information based on the most recent recovered clock adjustment.

During the training sequence, the narrow BW recovered clock 938 is adjusted once per 2 ms frame by 1/32 of a bit in order to maintain alignment with the incoming data transitions. The FOCC training sequence occurs preferably during the first 256 frames in MUX1 of the communication session and is normally not required for the remainder of the session, unless degraded channel conditions require the session to be reestablished.

After the training sequence, the acquisition complete signal 924 is high, and mux pair 926 couples a Frequency Direction (F Dir) signal 918 to the advance/retard output 930 and also couples a Frequency Adjust (F Adj) input 922 to the adjust output 928. The acquisition complete signal 924 also controls a multiplexer 986 which provides a clock input 988 to a flip flop 990. When the acquisition complete signal 924 is low, mux 986 couples the narrow center bit sample (NARROW_CBS) signal 942 to the flip flop clock source 988. When the acquisition complete signal 924 is high, mux 986 couples a wide center bit sample (WIDE_CBS) signal 984 to the flip flop clock source 988. Flip flop 990 samples the RX data signal 902 once at the center of each receive bit period, as determined by the alignment of the recovered clock source coupled to the clock input, and outputs the resultant 72 kbit data signal (CBS_DATA) 992 to the receive state machine (not shown).

When the FOCC 916 takes control of adjusting programmable divider 932, frequency correction adjustments which lock the recovered clock frequency to the incoming data frequency are combined with phase adjustments which are based on accumulation of phase error over preferably a minimum of 8 frames. This limited phase adjustment restricts the narrow BW recovered clock 938 from tracking fast timing fluctuations in the RX data signal 902 and thus provides a high stability reference clock (Div By Cntr 936) for the wide bandwidth loop and the transmitter (not shown).

The RX data signal 902 is also directed to the wideband loop and routed to transition detector 948 which, similar to transition detector 904, samples incoming data on 1/32 bit boundaries and detects whether or not a transition has occurred. The registered transitions are then applied to a phase detector 950 for phase comparison with a wide BW recovered clock signal 980. Phase detector 950 outputs the result of the phase comparison between the incoming data transition and the recovered clock on an early/late line 952 and also generates a detect signal 954 to indicate when the comparison is complete. The difference between the number of early or late transitions is accumulated in an early/late accumulator 956, which is preferably implemented with an up/down counter. A sign output 958 of the early/late accumulator signifies whether more early transitions or more late transitions have occurred during the accumulation period. The sign output 958 is directed to an increment/decrement (Inc/Dec) input of an up/down counter 970. A magnitude output 960, also generated from the early/late accumulator 956, signifies how many more early transitions than late transitions, or vice versa, have occurred during the accumulation period. The magnitude output 960 is provided to a comparator 966 for comparison with a predetermined wide loop BW value 964 which is set by controller 962. When the magnitude 960 exceeds the wide loop BW value set by the controller 962, comparator output 968 pulses high which adjusts up/down counter 970 in a direction set by the Inc/Dec input 958. This resets or clears early/late accumulator 956 so that early or late transition accumulation restarts with respect to the updated wide BW recovered clock phase. The predetermined wide loop BW value 964 set by the controller 962 is preferably less than 20, so that if the early transitions exceed the late transitions by 20, or the late transitions exceed the early transitions by 20, an adjustment is made to the Up/Down counter 970, and the early/late accumulator 956 is cleared.

Up/down counter 970 is designed to shift the phase of the narrow BW recovered clock by preferably a maximum of $15/32$ of a bit. This is accomplished with a 5 bit adder 974 and an invert MSB block 978 coupled to the adder output 976. A 5-bit output 972 generated from the up/down counter 970 is set to a value of 16 during reset which, when added to the 5-bit programmable counter output (Div By Cntr) 936 from the narrow BW loop at adder 974, provides 5 bit adder output 976 with the MSB inverted with respect to the programmable counter output 936. Block 978 then re-inverts the MSB of adder output 976 which brings the wide BW recovered clock 980 in phase with the narrow BW recovered clock 938. When the up/down counter 970 is incremented from 16 to 17, the wide BW recovered clock 980 is phase shifted by $1/32$ of a bit with respect to the narrow BW recovered clock 938. Counter 970 ranges from 1 to 31 which limits the maximum phase shift to $\pm 15/32$ of a bit. Adjustments to counter 970 align the rising edge of the 72 kHz wide BW recovered clock signal 980 to bit transitions in the 72 kbit data stream 902, which also aligns the falling edge of the recovered clock signal to the bit centers in the 72 kbit data stream. The wide BW recovered clock signal 980 is applied to inverter 982 to generate the wide center bit sample (WIDE_CBS) signal 984 with rising edge aligned with the RX data 902 bit centers.

In summary, the wide bandwidth loop rapidly adjusts recovered clock phase to track fast timing fluctuations in the RX data signal 902 and to insure optimum center bit sampling, while guarding against bit slippage by constraining phase adjustment to $\pm 15/32$ of a bit maximum from the high stability narrow BW recovered clock.

Circuit 971 provides reset control for the wide bandwidth loop which, when asserted, forces the wide loop to track in phase with the narrow loop. During the narrow loop training period, acquisition complete 924 is low which, when applied to inverter 977 and OR gate 979, holds up/down counter 970 in reset. After the training period, acquisition complete is high which allows the wide loop to track incoming data transitions. Signal quality with respect to the wide BW recovered clock is assessed on a frame by frame basis with signal quality detector 973, such as described in commonly assigned issued U.S. Pat. No. 5,333,153 entitled "Signal Quality Detection Method and Apparatus for Optimum Audio Muting" by Brown et al and hereby incorporated by reference.

When signal quality degrades below a predetermined threshold, signal quality detector 973 outputs a high signal which is applied to an AND gate 975. When the reset mask input 991 to AND gate 975 is high, the signal quality detector output is passed through to OR gate 979 and on to reset line 983. When reset line 983 is asserted, up/down counter 970 is set to a value of 16 and hysteresis counter 981 is cleared.

Hysteresis counter 981 is a frame counter which stops at a maximum value of 15. The value of hysteresis counter 981 is coupled to comparator 987 for comparison with hysteresis value 985. When the output of hysteresis counter 981 is below the hysteresis value 985, the comparator output 989 is low which, when applied to AND gate 979, masks or disables the signal quality detector output from continuously holding the up/down counter 970 in reset. This reset mask is maintained until hysteresis counter 981 increments above the hysteresis value 985 set by controller 962. As a result, when a frame with bad signal quality is detected, the wide loop is momentarily forced in phase with the narrow loop and is allowed a minimum number of flames, as determined by the hysteresis value 985, to regain alignment with incoming data. The reset circuit 971 in combination with the signal quality detector 973 provides a fast realignment mechanism and prevents the wide bandwidth loop from hanging up at one of the phase shift limits.

The narrowband DPLL may be selected to be a first order or a second order depending on which mode of operation the communication device is in. In a typical CT2 communication system, the communication protocol standard includes four main burst structures, called multiplex 3 (MUX 3), multiplex 2 (MUX 2) and multiplex I (MUX 1) which is further sub-divided into either multiplex 1.4 or 1.2 (MUX 1.4 or MUX 1.2). MUX 3 is utilized mainly for communication link initiation (link establishment and re-establishment) from a handset to a base station. MUX 2 is used primarily for communication link establishment and for link initiation from the base station. The MUX I burst structures (MUX 1.2 and MUX 1.4) are used primarily for voice/data communications and signaling information from the portable and base.

A first order narrow bandwidth is used when a MUX2 or MUX3 structure is used. In MUX2 there is synchronization information available in every burst so the PLL is not critical because the synchronization information provides frame alignment. When a MUX1 structure is used then the second order narrow bandwidth is enabled. Since there is no synchronization information present in a MUX1 structure, only incoming data transitions are able to be used for frame alignment. Operation with the nested PLL in MUX1 allows fast tracking of timing fluctuations with reduced potential of bit slippage.

While a hardware version of the nested phase lock loop has been described, it would be evident to one skilled in the art that the invention is not limited to hardware implementation. The nested phase lock loop is realizable in software with routines which mimic the functional blocks described in hardware.

Hence, the nested digital phase lock loop, as described by the invention, provides a method and apparatus for tracking timing fluctuations in a radio frequency signal in order to improve signal quality. The nested phase lock loop circuit consists of a first order wideband DPLL operatively coupled in parallel with a narrowband high stability second order DPLL. This nested configuration combines the advantages of fast data tracking using the wideband loop with high stability over-the-air clock recovery using the narrowband DPLL. In a delay spread environment, as previously described in the background, where the baseband timing will shift up to ±0.5 bit without substantial eye closure, this nested DPLL circuit allows high stability recovery of a phase shifting data signal while reducing the possibility of bit slippage. Radio transmitter timing, as well as the remainder of the TX and RX register timing, is derived from the second order DPLL recovered clock. This provides a stable time base for the transmit return path to the fixed part, which reduces the "round trip" timing fluctuations in a TDD system by a factor of 2 over the typical wideband DPLL implementation. The improved signal quality achieved by employing the nested digital phase lock loop as described by the invention helps maintain synchronization and reduces the occurrences of interruptions in a communication system.

What is claimed is:

1. A method for tracking receive data in order to improve receive signal quality in a digital communication system, comprising the steps off
   generating a reference clock signal;
   generating a first recovered clock signal phase related to the reference clock signal;
   receiving a data signal;
   locking the first recovered clock signal to a predetermined phase offset of the receive data signal;
   center bit sampling the receive data signal using the first recovered clock signal;
   generating a second recovered clock signal phase related to the first recovered clock signal; and
   center bit sampling the receive data signal with the second recovered clock signal once the first recovered clock signal is locked.

2. A method as described in claim 1, wherein the step of generating a first recovered clock signal includes the steps of:
   detecting transitions in the receive data signal;
   initially comparing the phase of the transitions to the reference clock;
   determining early and late transitions based on the step of comparing;
   accumulating the number of early and late transitions;
   comparing the number of early and late transitions to a first predetermined threshold; and
   phase shifting the reference clock to produce the first recovered clock signal in response to the accumulated number reaching the first predetermined threshold.

3. A method as described in claim 2, wherein the step of generating the second recovered clock signal includes the steps of:
   detecting transitions in the receive data signal;
   initially comparing the phase of the transitions to the first recovered clock signal;
   determining early and late transitions based on the step of comparing;
   accumulating the number of early and late transitions; and
   phase shifting the first recovered clock signal to produce the second recovered clock signal in response to the number of accumulations reaching a second predetermined threshold;

4. A method as described in claim 3, further comprising the steps of:
   determining the signal quality of the recovered data with reference to the second recovered clock signal; and
   resetting the phase of the second recovered clock signal such that it realigns with the phase of the first recovered clock signal when the signal quality drops below a predetermined threshold.

5. A digital phase lock (DPLL) loop circuit for use in a second generation cordless telephone system (CT2) employing MUX1, MUX2, and MUX3 communication protocols, comprising:
   a means for receiving an incoming data signal having timing fluctuations;
   a narrowband DPLL providing a first recovered clock signal;
   a wideband DPLL operatively coupled to the narrowband DPLL, providing a second recovered clock signal phase related to the first recovered clock signal, the wideband DPLL limiting the phase shift between the first and second recovered clock signals;
   said narrowband and wideband DPLLs providing a means for tracking timing fluctuations in the received data signal using the first and second recovered clock signals;
   the received data signal being center bit sampled with the second recovered clock signal when a MUX 1 protocol is employed; and
   the received data signal being center bit sampled with the first recovered clock signal when either a MUX2 or MUX3 protocol is employed.

6. A nested digital phase lock loop (DPLL) circuit, comprising:
   an input for receiving a recovered data signal;
   an oscillator circuit providing a reference signal;
   a narrowband DPLL for generating a first recovered clock signal phase related to the reference signal, and for initially locking the first recovered clock signal to the phase of the recovered data signal;
   a wideband DPLL operatively coupled to the narrowband DPLL, for generating a second recovered clock signal phase related to the first recovered clock signal;
   a logic means for selecting between the first and second recovered clock signals, the first recovered clock signal being selected until the narrowband loop has locked, and the second recovered clock signal being selected once the narrowband loop has locked; and
   a logic gate for clocking the recovered data signal using the selected first or second recovered clock signal.

7. A nested DPLL as described in claim 6, further comprising a signal quality detector for realigning the phase of the second recovered clock signal to the phase of the first recovered clock signal when the signal quality falls below a predetermined threshold.

8. A nested DPLL as described in claim 6, wherein the narrowband DPLL includes a phase detector, narrowband accumulator, and phase adjuster for determining the amount of phase shift required with respect to the reference signal based on the phase of the incoming recovered data signal.

9. A nested DPLL as described in claim 8, wherein the wideband DPLL includes a phase detector, wideband accumulator, and phase adjuster for determining the amount of phase shift with respect to the first recovered clock based on the phase of the incoming recovered data signal.

10. A nested DPLL as described in claim 9, wherein the maximum amount of phase shift between the first recovered clock signal and the second recovered clock signal is 15/32 of a bit.

11. A method for center bit sampling recovered data using a narrowband digital phase lock loop (DPLL) and a wideband DPLL, comprising the steps of:

receiving the recovered data;

generating a first recovered clock signal from the narrowband DPLL circuit;

center bit sampling the recovered data using the first recovered clock signal;

locking the narrowband DPLL circuit;

generating a second recovered clock signal from the wideband DPLL;

phase relating the second recovered clock signal to the first recovered clock signal up to a predetermined maximum phase shift; and center bit sampling the recovered data using the second recovered clock signal in response to the locking of the narrowband DPLL.

12. A method for center bit sampling recovered data as described in claim 11, further comprising the steps of:

measuring the signal quality of the recovered data;

adjusting the phase of the second recovered clock signal in response to the signal quality of the center bit sampled data falling below a predetermined threshold;

waiting a predetermined amount of time; and re-measuring the signal quality of the center bit sampled data.

13. A method as described in claim 11, wherein the step of generating the second recovered clock signal includes the step of limiting the phase of the second recovered clock signal with respect to the first recovered clock signal by less than ±½ bit.

14. A nested digital phase locked loop (DPLL) circuit providing accurate center bit sampling of recovered data in a digital communication system, comprising:

a narrowband DPLL for receiving recovered data and for providing a first recovered clock signal based on the phase of the recovered data;

a wideband DPLL for receiving the recovered data and for generating a second recovered clock signal in response to the phase of the first recovered clock signal and the phase of the incoming data; and a means for selecting either the first or second recovered clock signals for center bit sampling the recovered data.

15. A nested digital phase lock loop circuit as described in claim 14, wherein the narrowband DPLL circuit comprises:

a reference clock;

a phase detector for detecting early/late transitions in the recovered data as compared to the first recovered clock signal;

a narrow bandwidth filter for accumulating a number of early/late transitions in the recovered data and providing an adjust value when the number of early/late transitions exceeds a predetermined threshold;

a phase adjust circuit for receiving the reference clock and shifting it by the adjust value indicated by the narrowband filter to provide the first recovered clock signal.

16. A nested digital phase lock loop circuit as described in claim 15, wherein the wideband DPLL circuit comprises:

a phase detector for detecting early and late transitions in the recovered data as compared to the second recovered clock signal;

a wideband filter for accumulating the number of early and late transitions in the recovered data and comparing it to a predetermined threshold in order to provide a wideband adjust value when the number of early and late transitions exceeds the predetermined threshold; and a phase shift circuit for receiving the first recovered clock signal and the wideband adjust value and shifting said first recovered clock signal by the wideband adjust value to provide the second recovered clock signal.

17. A nested digital phase lock loop as described in claim 16, wherein the wideband DPLL further comprises:

a signal quality detector means for comparing the signal quality of the recovered data to a predetermined threshold, the phase of the second recovered clock signal being phase aligned with the first recovered clock signal when the recovered data falls below the predetermined threshold.

18. A radio circuit, comprising:

a receiver for receiving an incoming radio frequency (RF) signal and providing a demodulated limited data signal having fast timing fluctuations;

a nested digital phase lock loop (DPLL) for center bit sampling the demodulated limited data signal, including:

a narrowband DPLL for receiving the demodulated limited data signal and providing a first recovered clock signal based on the phase of demodulated limited data signal; and a wideband DPLL for receiving the demodulated limited data signal and for generating a second recovered clock signal within predetermined phase shift limits of the first recovered clock signal in response to the phase of the demodulated limited data signal, said wideband loop rapidly adjusting the phase of the second recovered clock to track the fast timing fluctuations in the demodulated limited data signal.

19. A radio as described in claim 18, the nested DPLL further comprising:

a means for selecting either the first recovered clock signal or the second recovered clock signal to center bit sample the demodulated limited data signal;

20. A radio as described in claim 18, wherein the demodulated limited data signal is received over a predetermined number of receive frames and the nested DPLL further comprises:

a signal quality detector means for determining the signal quality of the demodulated limited data signal over the predetermined number of receive frames and for readjusting the second recovered clock signal to phase align with the first recovered clock signal when the signal quality drops below a predetermined threshold.

21. A radio as described in claim 18, further comprising a transmitter, said narrowband DPLL providing a timing reference for said transmitter using said first recovered clock signal.

\* \* \* \* \*